(12) United States Patent
Zuo

(10) Patent No.: US 6,631,077 B2
(45) Date of Patent: Oct. 7, 2003

(54) HEAT SPREADER WITH OSCILLATING FLOW

(75) Inventor: Jon Zuo, Lancaster, PA (US)

(73) Assignee: Thermal Corp., Stanton, DE (US)

( * ) Notice: Subject to any disclaimer, the term of this patent is extended or adjusted under 35 U.S.C. 154(b) by 0 days.

(21) Appl. No.: 10/073,537

(22) Filed: Feb. 11, 2002

(65) Prior Publication Data

US 2003/0151895 A1 Aug. 14, 2003

(51) Int. Cl.[7] .................................................. H05K 7/20
(52) U.S. Cl. .................. 361/699; 361/689; 361/698; 361/704; 257/706; 257/714; 174/15.1; 165/80.4; 165/104.33; 165/185
(58) Field of Search ................... 361/689, 690, 361/697, 698, 699, 700; 257/714, 715; 174/15.1, 15.2, 16.3; 165/80.4, 104.33

(56) References Cited

U.S. PATENT DOCUMENTS

| | | | |
|---|---|---|---|
| 5,238,056 A | 8/1993 | Scotti et al. ............ 165/109.1 |
| 5,336,062 A | 8/1994 | Richter .................... 417/413 |
| 5,453,641 A | * 9/1995 | Mundinger et al. ......... 257/714 |
| 5,466,932 A | 11/1995 | Young et al. ............... 250/289 |
| 5,529,465 A | 6/1996 | Zengerle et al. .......... 417/413.2 |
| 5,646,824 A | * 7/1997 | Ohashi et al. ............. 361/699 |
| 5,763,951 A | 6/1998 | Hamilton et al. .......... 257/714 |
| 5,801,442 A | 9/1998 | Hamilton et al. .......... 257/714 |
| 5,901,037 A | 5/1999 | Hamilton et al. .......... 361/699 |
| 5,966,940 A | 10/1999 | Gower et al. ............... 62/3.3 |
| 5,998,240 A | 12/1999 | Hamilton et al. .......... 438/122 |
| 6,019,165 A | * 2/2000 | Batchelder ............... 165/80.3 |
| 6,219,237 B1 | * 4/2001 | Geusic et al. .............. 361/699 |
| 6,490,159 B1 | * 12/2002 | Goenka et al. ............. 361/700 |
| 6,529,377 B1 | * 3/2003 | Nelson et al. ............. 361/699 |

OTHER PUBLICATIONS

Internet Sheet, "Mechanics", dated Oct. 11, 2001, P. 1 of 1, website: www.almaden.ibm.com/sst/html/mech/microactuator.htm.

Internet Sheet, "Micro actuator systems for Nano–Position Control", dated Oct. 11, 2001, Pp. 1–2, website: http://utep.el.utwente.nl/tt/projects/electact/.

Internet Sheet, Design of Surface Micromachined Micro Actuators:, dated Oct. 11, 2001, Pp. 1–3, by Prof. Dr.–Ing. Ernst Obermeier, website: http://www–mat.ee.tu–berlin.de/research/actuator/design.htm.

Internet Sheet "Micromachine Technology (VIII)", dated Oct. 11, 2001, Pp. 1–3, website: http://www.iijnet.or.jp/MMC/no.14/tec/tech.htm.

Internet Sheet "Cycle Thermodynamic Model", dated Oct. 11, 2001, Pp. 1–14 website: http://www.me.gatech.edu/energy/andy_phd/three.htm.

* cited by examiner

Primary Examiner—Boris Chérvinsky
(74) Attorney, Agent, or Firm—Duane Morris LLP

(57) ABSTRACT

A heat spreader includes a plate having a first and second ends and a plurality of channels between the ends. A reservoir is located at the first end. A fluid oscillator oscillates a fluid between the first and second ends with a reciprocating flow. The oscillator is integrally contained within the plate.

21 Claims, 5 Drawing Sheets

HEAT SPREADER WITH OSCILLATING FLOW

FIELD OF THE INVENTION

The present invention generally relates to thermal management in electronic devices.

BACKGROUND OF THE INVENTION

The performance of electronic circuits and their semiconductor devices ("chips") is limited by temperature. Semiconductor device performance degrades when the internal temperature reaches or exceeds a particular limit. For example, in silicon integrated circuit devices, for each ten degree centigrade rise in junction temperature, the operating lifetime of the semiconductor device is decreased by a factor of at least two. Demands by OEMs for smaller package sizes and increased device densities has resulted in higher power densities, with the concomitant need for efficient heat dissipation becoming extremely important.

This industry need is compounded, in next generation, highly integrated semiconductor devices by the occurrence of "hot spots", i.e., localized areas on the chip having relatively high thermal energy generation. These hot spots arise at locations on the chip where significant electrical activity occurs, e.g., processor, I/O control circuits, etc. The manner of cooling these devices has depended upon many parameters, including the space available for the cooling process, the temperatures to be encountered, the location(s) of hot spots, and the ability to distribute or "spread" the thermal energy over sufficient surface area to provide for efficient heat transfer. In the past, simply passing a fluid over the device or, over a finned heat sink that is attached to the device, was sufficient to maintain the semiconductor at safe operating temperatures. Different cooling fluids have been used, depending upon the application and the density of the electronic devices in a given circuit. Boiling liquids are often used, such as fluorinated hydrocarbon refrigerants, which are delivered to the semiconductor device in liquid form, and are then boiled to remove heat. These systems often have the highest heat removal rate for a limited area, but require a considerable amount of power to operate, i.e. to be pumped to and from the heat transfer site.

It is also well known in the art to employ micro-pump driven heat exchangers to cool semiconductor devices and packages. For example, U.S. Pat. No. 5,336,062, issued to Richter, discloses a micro miniaturized pump consisting of two superposed, interconnected pump bodies of semiconductor material, which each include electrically conductive regions insulated from one another. This micro miniaturized pump includes a thin, flexible diaphragm having at least one integrated check valve, which has an inlet aperture and a cover plate over it. This pump is adapted for circulatory movement of coolant close to an electronic device. Similar micro miniature pumps are also disclosed in U.S. Pat. Nos. 5,466,932, issued to Young, et al., and 5,529,465, issued to Zengerle, et al.

The Northrop Grummand Corporation owns U.S. Pat. Nos. 5,763,951; 5,801,442; 5,901,037; and 5,998,240, all issued to Hamilton, et al., which disclose various methods of extracting heat from a semiconductor body through the use of micro channels formed in one or more pieces of silicon, and the circulatory movement of a coolant through those micro channels.

U.S. Pat. No. 5,238,056, issued to Scotti, et al., discloses various heat exchange apparatus in which an oscillating flow of primary coolant is used to dissipate an incident heat flux. Here the oscillating flow may be imparted by a reciprocating piston, a double-action twin reciprocating piston, a fluidic oscillator, or a electromagnetic pump.

These and other prior art devices use microstructures positioned close to the surface of a semiconductor device that act as a heat exchanger having coolant circulating through channels to transfer thermal energy away from the semiconductor device and its package, but do not provide an efficient heat spreading mechanism for distributing the thermal energy generated by hot spots on the chip across the package itself. There is a need for a semiconductor packaging structure that efficiently and evenly spreads thermal energy generated by hot spots on a chip across a substantial portion of the package so that the thermal energy may be removed rapidly and effectively from the package.

SUMMARY OF THE INVENTION

The present invention is a heat spreader comprising: a plate having a first end and a second end and a plurality of channels therebetween; a reservoir at the first end; and an oscillator for oscillating a fluid between the first and second ends, the oscillator being integrally contained within the plate.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein.

DETAILED DESCRIPTION OF THE PREFERRED EMBODIMENT

Figure 1:
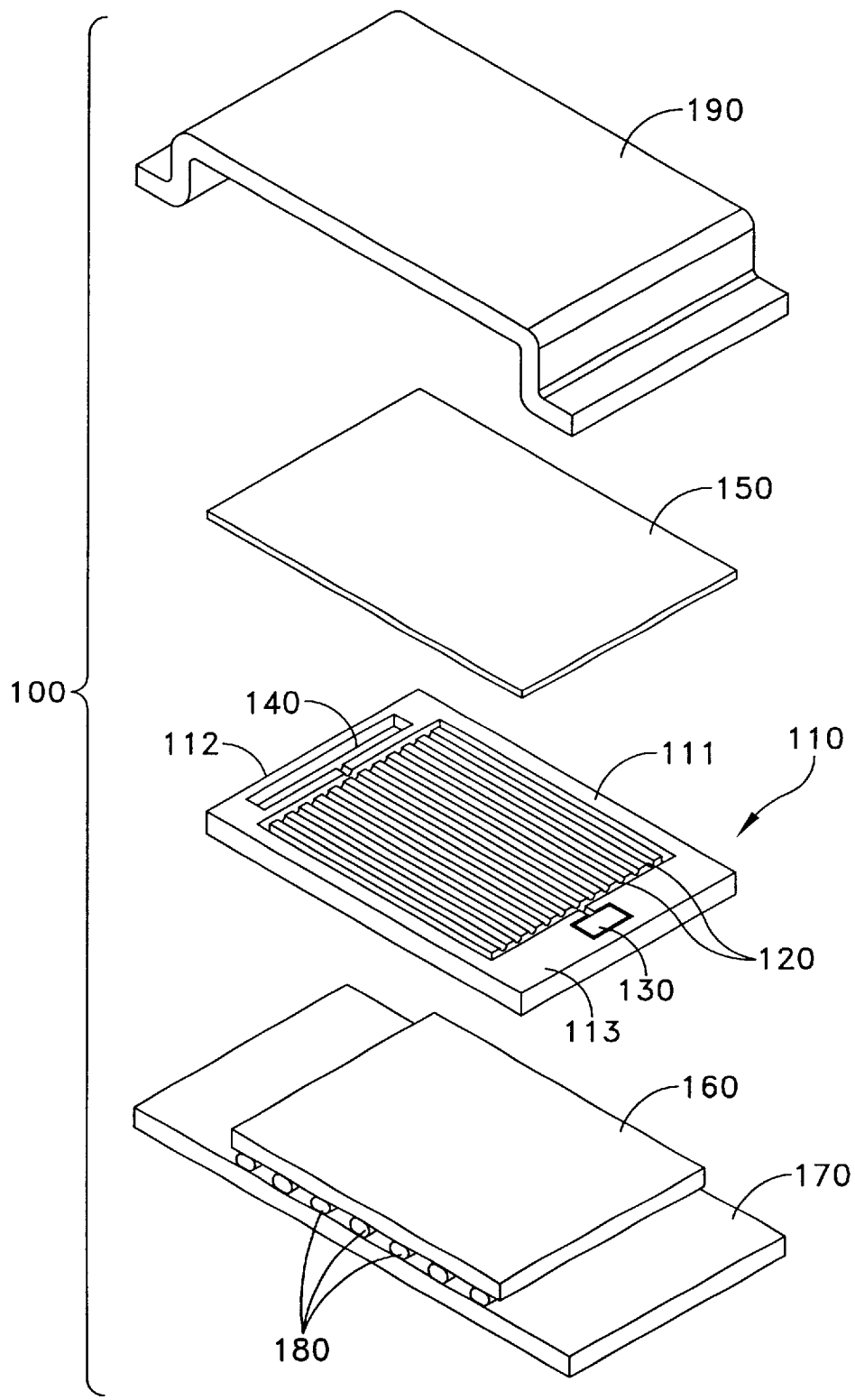
FIG. 1 is an exploded isometric view of a first exemplary heat spreader according to the present invention.
Figure 2:
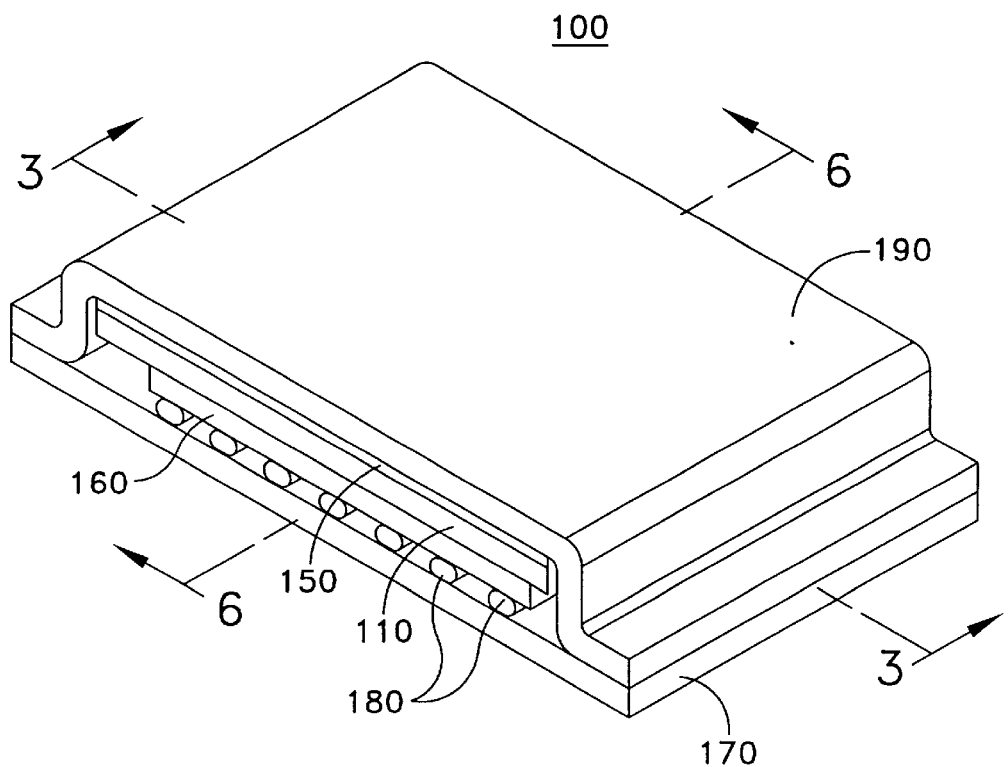
FIG. 2 is an isometric assembly view of the heat spreader shown in FIG. 1.
Figure 3:
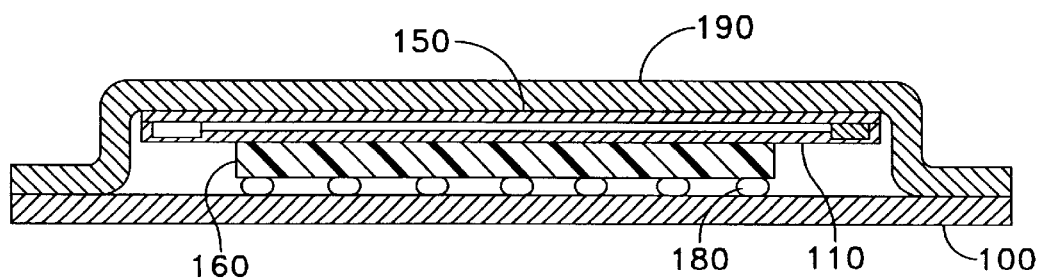
FIG. 3 is a cross sectional view of the heat spreader, taken along section line 3—3 of FIG. 2.
Figure 4:
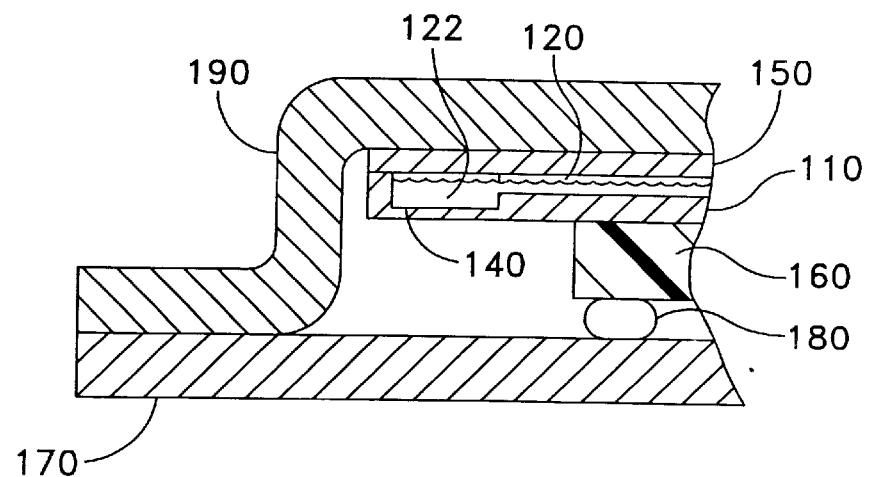
FIG. 4 is an enlarged detail of the reservoir shown in FIG. 3.
Figure 5:
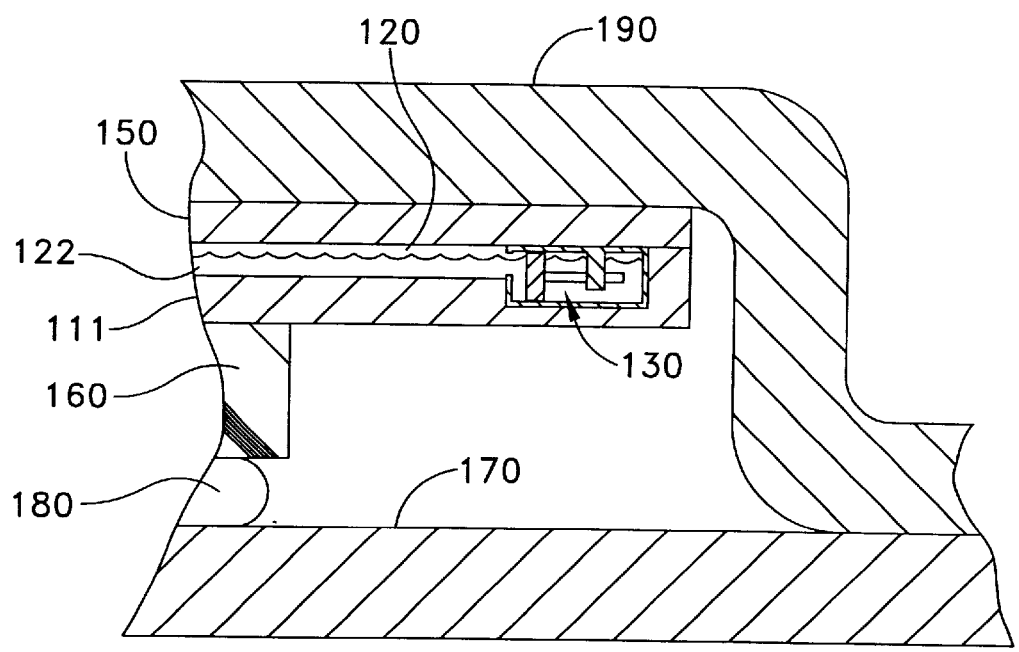
FIG. 5 is an enlarged detail of the micro actuator shown in FIG. 3.
Figure 6:
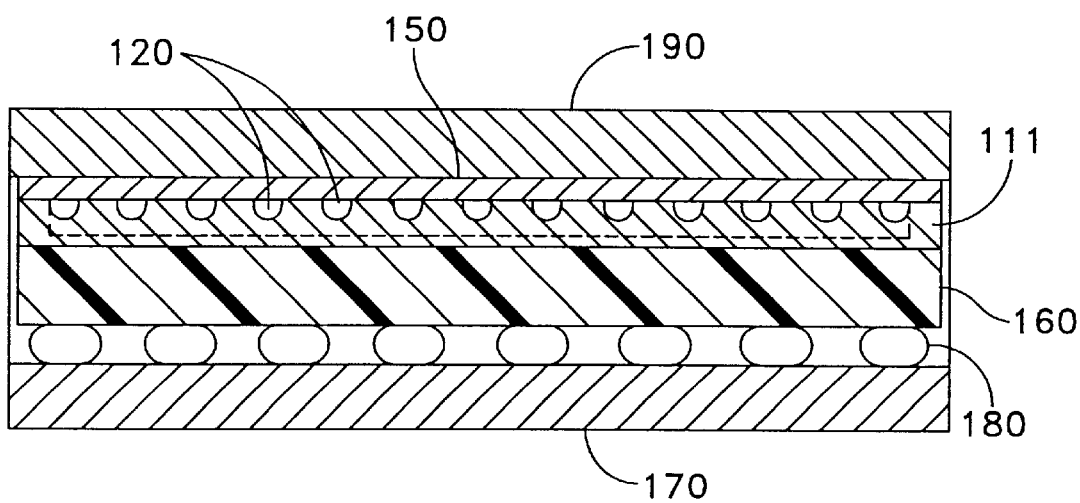
FIG. 6 is a cross sectional view of the heat spreader, taken along section line 6—6 of FIG. 2.

This description of preferred embodiments is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation.

FIGS. 1–6 show a first exemplary printed circuit board assembly 100. Assembly 100 includes a printed circuit board 170. An integrated circuit (IC) may be connected electrically and mechanically to the printed circuit board 170 by any suitable method, including wire bonding, flip-chip, or the like. In FIGS. 1–6, IC 160 is connected by a plurality of solder bumps 180.

A heat spreader 110 is thermally coupled to the IC 160. A heat transfer medium (not shown) of a type well known in the art may be positioned between the top surface of IC160 and heat spreader 110 to thermally couple them together. The heat transfer medium may comprise silicon adhesive, a thermal grease, a metal filled epoxy, indium, solder or the like. The thickness of the heat transfer medium will vary depending upon the performance requirements of IC 160. Generally, the thickness of the heat transfer medium varies between about 0.2 millimeters (mm) to about 0.8 millimeters (mm).

Heat spreader 110 includes a base plate 111 having a first end 112, a second end 113, and a plurality of channels 120 (which may be miniature channels) therebetween. Preferably, the channels 120 are micro-channels, which have a high heat flux capability. A reservoir 140 is located at the first end. The reservoir is connected to at least one channel 120. In the embodiment of FIG. 1, the channels 120 are straight, parallel channels, and all of the channels are connected to the reservoir 140. Base plate 111 may have any desired number of channels 120, such as 100 channels, for example.

Means 130 are provided for oscillating a fluid 122 (FIG. 5) between the first end 112 and the second end 113, with a reciprocating flow. The oscillating means 130are integrally contained within the plate 111, and are preferably located at the second end 113 of the plate, opposite the reservoir 140. The actuation scheme may include electrostatic, electrokinetic, electroosmotic, electromagnetic, electrochemical, thermal or piezoelectric techniques. The oscillating means may be one of a variety of oscillators, including, but not limited to, a micro actuator 130, a piezoelectric device 730 (FIG. 7) a micro mechanical pump (not shown), a diaphragm pump (not shown), a heat driven bubble pump (not shown), and electors-kinetic pump (not shown) and the like. Preferably, a compact, easily fabricated oscillating means is used. Piezoelectric devices or miniature membrane type actuators may be easier to fabricate these other types.

Preferably, the oscillating means 130 oscillates the working fluid with an adjustable pulse amplitude and an adjustable pulse frequency. More preferably, the pulse amplitude and frequency should be electronically adjustable. A heat spreader 110 so designed acts like a plate with an adjustable thermal conductivity. An example of a configuration is described in Table 1.

TABLE 1

| Fluid: | Water | Water |
|---|---|---|
| Temperature: | 60° C. | 60° C. |
| Frequency: | 80 Hz | 160 Hz |
| Amplitude: | 2 mm | 2 mm |
| Channel dimension | 1 mm hydraulic diameter | 1 mm hydraulic diameter |
| Equivalent K of the plate: | 677 W/m-° C. | 1,373 W/m-° C. |

The equivalent conductivity K is used as a measure of the effectiveness of the heat spreader. K can be determined by transferring an equal rate of heat (in Watts) through the heat spreader 110 and a solid plate, and setting $KA_H\Delta T_H/L_H$ for the heat spreader equal to $kA_p\Delta T_p/L_p$ for the solid plate, where the subscripts H and P stand for heat spreader and plate, respectively, k is the thermal conductivity of the solid plate, A is the area through which the heat is passed, $\Delta T$ is the temperature difference across the heat spreader or plate, and L is the length of the heat spreader or plate, in the direction of heat transfer. If a solid plate of the same dimensions as the heat spreader is compared to the heat spreader results, then $K/k=\Delta T_p/\Delta T_H$.

In an experiment with the cases in Table 1, the higher frequency case provides an equivalent thermal conductivity that is over 2000 times that of water, over nine times that of silicon, and over three times that of copper. The pumping power for a 1-centimeter square plate is less than 0.1 W for both the cases listed in Table 1.

Table 2 lists thermal performance data for another example:

TABLE 2

| Heat spreader material | Silicon |
|---|---|
| Heat spreader footprint | 2 cm by 5 cm |
| Flow channel cross-sectional dimensions | 0.1 mm square |
| Number of channels | 100, in parallel |
| Fluid | Water, single-phase liquid |
| Oscillating frequency | 400 Hz |
| Oscillating amplitude | 2 mm, in axial direction |
| Equivalent thermal conductivity of the heat spreader | 5,100 W/m-K |
| Power required from actuator | 0.09 W |

At a 400 Hz oscillating frequency, this heat spreader has an equivalent thermal conductivity that is 34 times that of silicon and 12.5 times that of copper. It outperforms even the most advanced composite materials by a factor of 2 to 3 in terms of thermal conductivity. The 5,100 W/m-K equivalent thermal conductivity also compares very favorably to micro-machined heat pipe heat spreaders.

The working fluid 122 may be any of a variety of fluids. The working fluid can have a one-phase flow or a two phase flow. Two phase flow may be preferred for dissipating high heat fluxes, because the liquid-vapor system maintains a constant temperature. Single phase flow may be preferable in some instances where fine control is required, because the equivalent thermal conductivity is linearly dependent on oscillating frequency in single phase flow, whereas the relationship between effective conductivity and frequency in two-phase flow is non-linear and more complex.

The plate 111 may be formed of any material so long as the material is compatible with the fluid and impermeable to gases. For example, a plate made of silicon may be desirable, because it matches the coefficient of thermal expansion (CTE) of the integrated circuit chip material, and has exceptional thermal conductivity, making it ideal for cooling an IC 160. Another advantage of silicon is that the micro channels can be easily formed using conventional semiconductor fabrication techniques. An alternative exemplary material for the plate 111 is AlSiC, which has a CTE close to that of silicon.

A cover 150 is sealingly joined to base plate 111 to prevent egress of fluid 122 or ingress of gas or contaminants. A housing 190 contains the heat spreader 110 and IC 160. Preferably, housing 190 is formed of a highly conductive material. Housing 190 may also have a heat sink or a plurality of fins (not shown) attached thereto, to dissipate the heat from the heat spreader 110.

The exemplary plate 111 is flat. It is contemplated that devices operating under the same principles as the exemplary embodiment may have different shapes, such as curved surfaces.

Figure 7:
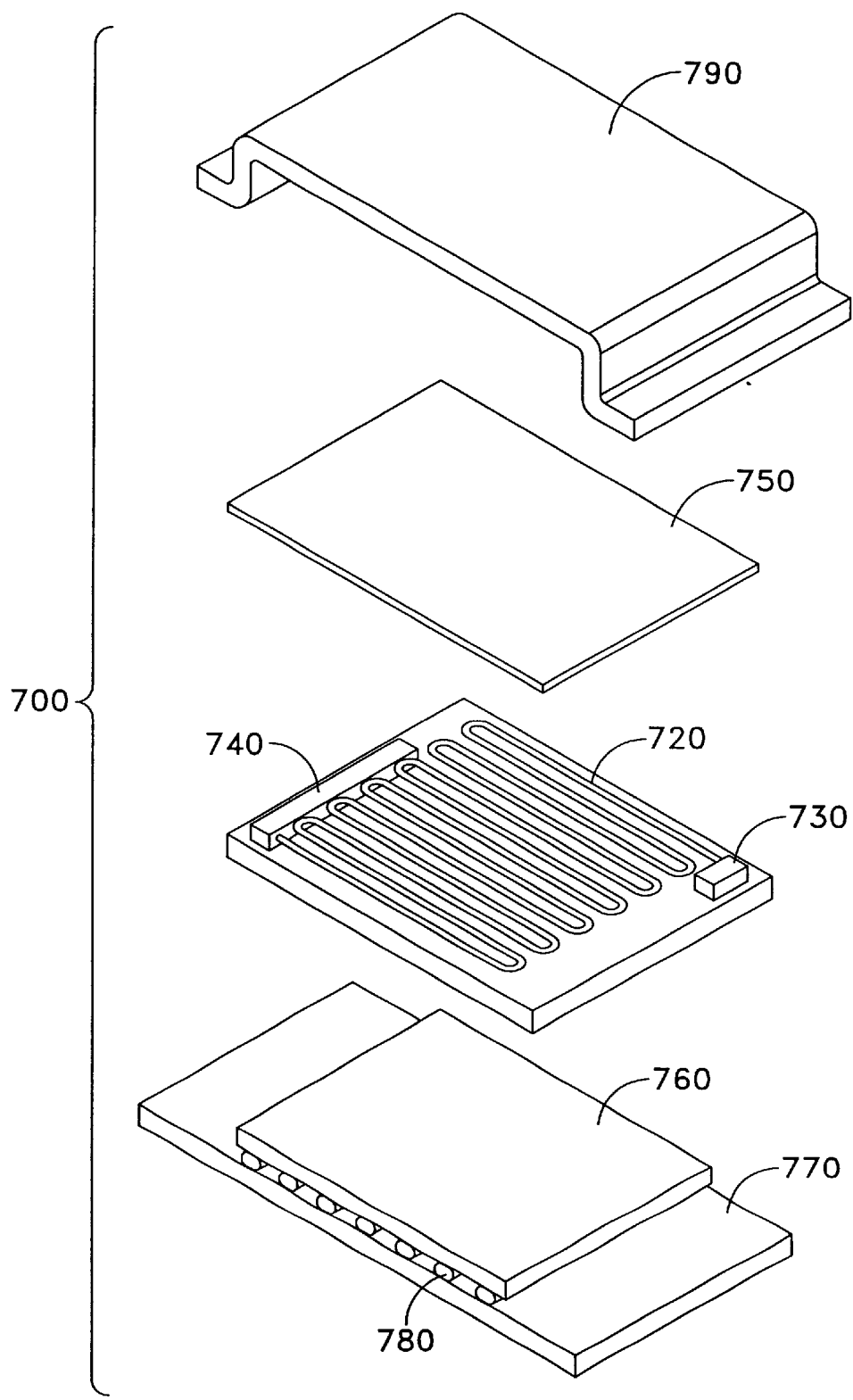
FIG. 7 is an exploded isometric view of a second exemplary heat spreader.

In the embodiment of FIGS. 1–6, the plurality of channels 120 are parallel to each other, and all of the channels connect to the reservoir. FIG. 7 shows a second exemplary embodiment, wherein the plurality of channels 720 are connected in a continuous serpentine pattern. Another difference between heat spreader 110 and heat spreader 720 is that in heat spreader 720, the exemplary oscillating means 730 is a piezoelectric device. However, either of the embodiments of FIGS. 1–6 or 7 can be used with any oscillating means as described above, or an equivalent. Other features of heat assembly 700 include reservoir 740, printed circuit board 770, IC 760, solder bumps 780, and housing 790, which are similar to those described above.

In operation, during the oscillations, the fluid 122 alternately partially (or completely) fills reservoir 140, and then completely (or partially) withdraws from the reservoir. During the oscillations, heat is removed and spread by the enhanced thermal diffusion effect that is similar to a "bucket brigade effect." By varying the voltage and frequency of the input to the oscillating means 130, the thermal performance of the heat spreader is controlled.

A variety of manufacturing methods may be employed. As an example, the flow channels 120, reservoir 140 and oscillating means 130 may be fabricated using multiple silicon wafers and micro machining with deep reactive ion etching (DRIE). The process begins with the layout of the photolithography masks using a computer aided drawing program. The design may use three or four mask levels to define the various components. In one example, the flow channels are etched into one substrate (base plate 111) with a second substrate 150 acting as the cover. The base plate and cover may be bonded together, using, for example, soldering or a diffusion bonding process. A helium leak test may be performed to ensure a hermetic seal. Alternatively, the oscillating means 130 may be a micro actuator formed with features on both the base plate substrate and the cover substrate.

At the time of fabrication, the channels and reservoir are evacuated, for example, by connecting the channels to a vacuum pump. The working fluid 122 is then provided to the channels at approximately atmospheric pressure. The channels are sealed off, and the plate 111 is heated until the fluid saturation temperature at atmospheric pressure (e.g., 100° C. for water). The channels are again opened to allow vapor to escape so that a desired pre-determined fill level for the channels is achieved. Then the channels are permanently sealed.

Because the effective conductivity of the heat spreader can be varied electronically, the design of heat spreader 110 is less dependent on the fluid properties than prior art thermal control systems.

An advantage of the exemplary heat spreader is greater flexibility in choice of the working fluid 122 than is available for passive heat pipe heat spreaders. Whereas heat pipes require the fluid to have a large surface tension and latent heat of vaporization, the exemplary embodiments do not. Thus, the exemplary embodiments can be formed with lighter materials.

The exemplary heat spreaders can be made very compact. In particular, compared to circulating fluid cooled systems, the exemplary heat spreaders do not require a fluid return path. Further, by using an oscillating means 130 that is integrally contained within the profile of the plate, the heat spreader saves space and allows a good thermal interface to any flat surface. Still further, the amount of power used to drive the oscillating flow is favorable compared to circulating flow pumps, which require much more power to overcome the large pressure drop in the narrow micro channels 120.

Although the invention has been described in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A heat spreader positioned within a housing containing an integrated circuit comprising:
   a plate having a first and second ends and a plurality of channels therebetween, said plate being coupled to a top surface of said integrated circuit and;
   a reservoir at the first end; and
   a piezoelectric oscillator for oscillating a fluid between the first and second ends with a reciprocating flow, the oscillator being integrally contained within the plate.

2. The heat spreader of claim 1, wherein the channels are micro channels.

3. The heat spreader of claim 1, wherein the oscillator oscillates the working fluid with an adjustable pulse amplitude.

4. The heat spreader of claim 1, wherein the oscillator oscillates the working fluid with an adjustable pulse frequency.

5. The heat spreader of claim 1, wherein the oscillator oscillates the working fluid with an adjustable pulse amplitude and an adjustable pulse frequency.

6. The heat spreader of claim 1, wherein the fluid is a liquid.

7. The heat spreader of claim 1, wherein the fluid has a two-phase flow.

8. The heat spreader of claim 7, wherein the fluid includes liquid phase material and gas phase material.

9. The heat spreader of claim 1, wherein the oscillator is positioned at the second end of the plate.

10. The heat spreader of claim 1, wherein the plate is flat.

11. The heat spreader of claim 1, wherein the plurality of channels are parallel to each other.

12. The heat spreader of claim 1, wherein the plurality of channels are connected in a continuous serpentine pattern.

13. The heat spreader of claim 1, wherein the oscillator include a piezoelectric device.

14. The heat spreader of claim 1, wherein the oscillator include one of the group consisting of a micro actuator, a piezoelectric device, a micro mechanical pump, a diaphragm pump and a bubble pump.

15. The heat spreader of claim 1, wherein the plate is formed of silicon or ALSiC or CwW or other low CTE materials.

16. A heat spreader hermetically sealed within a housing containing an integrated circuit, said heat spreader comprising:
   a plate having a first and second ends and a plurality of channels therebetween, said plate being coupled to a too surface of said integrated circuit within said an integrated circuit housing;
   a reservoir at the first end; and
   means for oscillating a fluid between the first and second ends with a reciprocating flow, the oscillating means being integrally contained within the plate.

17. Apparatus comprising:
   a circuit board;
   an integrated circuit hermetically sealed within a housing and connected to the circuit board; and
   a heat spreader thermally coupled to the integrated circuit within said housing, comprising:

a plate having a first and second ends and a plurality of channels therebetween;

a reservoir at the first end; and a piezoelectric oscillator for oscillating a fluid between the first and second ends with a reciprocating flow, the oscillator being integrally contained within the plate.

18. The heat spreader of claim 16, wherein the oscillator oscillates the working fluid with at least one of the group consisting of an adjustable pulse frequency an adjustable pulse amplitude.

19. The heat spreader of claim 16, wherein the fluid has a two-phase flow.

20. The heat spreader of claim 16, wherein the plate is made of silicon or ALSiC or CwW or other low CTE materials.

21. A thermally efficient semiconductor packaging structure comprising:

a hermetically sealed housing;

an integrated circuit located within said housing, said integrated circuit having a top surface; and a heat spreader positioned within said housing and thermally and mechanically coupled to said top surface of said integrated circuit, said heat spreader comprising;

a plate having a first and second ends and a plurality of channels therebetween and;

a reservoir at the first end; and a piezoelectric oscillator for oscillating a fluid between the first and second ends with a reciprocating flow, the oscillator being integrally contained within the plate.

* * * * *

UNITED STATES PATENT AND TRADEMARK OFFICE
CERTIFICATE OF CORRECTION

PATENT NO.   : 6,631,077 B2  
DATED        : October 7, 2003  
INVENTOR(S)  : Jon Zuo It is certified that error appears in the above-identified patent and that said Letters Patent is hereby corrected as shown below:

<u>Column 5,</u>
Line 55, change "too" to -- top --

Signed and Sealed this

Thirtieth Day of December, 2003

JAMES E. ROGAN
*Director of the United States Patent and Trademark Office*